United States Patent
Law et al.

(10) Patent No.: US 8,674,510 B2
(45) Date of Patent: Mar. 18, 2014

(54) THREE-DIMENSIONAL INTEGRATED CIRCUIT STRUCTURE HAVING IMPROVED POWER AND THERMAL MANAGEMENT

(75) Inventors: Oscar M. K. Law, Hsinchu (TW); Kuo H. Wu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 353 days.

(21) Appl. No.: 12/846,418

(22) Filed: Jul. 29, 2010

(65) Prior Publication Data

US 2012/0025388 A1 Feb. 2, 2012

(51) Int. Cl.
*H01L 29/40* (2006.01)

(52) U.S. Cl.
USPC ........... 257/773; 257/777; 257/686; 257/713; 257/173; 257/E23.08; 257/E23.011; 438/118

(58) Field of Classification Search
USPC ........... 257/773, 777, 686, 713, 173, E23.08, 257/E23.011, 118
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |

(Continued)

FOREIGN PATENT DOCUMENTS

CN 101038908 9/2007

OTHER PUBLICATIONS

Office Action dated Sep. 21, 2012 from corresponding application No. CN 201010575666.1.

*Primary Examiner* — Elias M Ullah
(74) *Attorney, Agent, or Firm* — Lowe Hauptman & Ham, LLP

(57) ABSTRACT

A three dimensional (3D) integrated circuit (IC) structure having improved power and thermal management is described. The 3D IC structure includes at least first and second dies. Each of the first and second dies has at least one power through silicon via (TSV) and one signal TSV. The at least one power and signal TSVs of the first die are connected to the at least one power and signal TSVs of the second die, respectively. The 3D IC structure also includes one or more peripheral TSV structures disposed adjacent to one or more sides of the first and/or the second die. The peripheral TSV structures supply at least power and/or signals.

20 Claims, 3 Drawing Sheets

(56) References Cited

U.S. PATENT DOCUMENTS

| | | |
|---|---|---|
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2010/0187683 A1* | 7/2010 | Bakir et al. .................... 257/713 |
| 2010/0199236 A1* | 8/2010 | Chen et al. ........................ 716/3 |

\* cited by examiner

THREE-DIMENSIONAL INTEGRATED CIRCUIT STRUCTURE HAVING IMPROVED POWER AND THERMAL MANAGEMENT

BACKGROUND

The disclosure relates generally to three-dimensional (3D) integrated circuit (IC) structures, and more particularly, to 3D IC structures having improved power and thermal management.

To the inventor's knowledge, 3D ICs are a potential solution to traditional two-dimensional (2D) ICs to overcome the interconnect scaling barrier and improve performance. In 3D ICs, multiple dies are stacked together using vertical through silicon vias (TSVs) where longer wire connections and inter-die input/output (I/O) pads are eliminated, resulting in overall performance improvements, including faster and more power efficient inter-core communication across multiple silicon layers. FIG. 1 is a cross-sectional view of a current 3D IC structure 10 having dies A, B, C, and D stacked one on top of another on a substrate 20, each of the dies A, B, and C having one or more TSVs 40 for inter-die communication. FIG. 2 is a top view of the 3D IC structure of FIG. 1.

There are power and thermal management challenges with respect to 3D IC technology. When multiple dies are stacked together, the total power is the sum of the individual dies. The stacked dies and TSV resistance are added in series for power routing. This causes high current (I) and resistance (R) that can lead to a significant IR drop (i.e., voltage drop). To address the IR drop problem, a dense power network is required and additional bottom die areas are reserved for inter-die power supply—but this occupies significant routing resources and leads to routing congestion resulting in a large die area. The area penalty increases dramatically when the numbers of stacked dies are increased.

Furthermore, when multiple dies are stacked together, heat trapped between the die interfaces is difficult to dissipate through the dielectric layer. The increased temperature results in performance degradation and reliability problems. Expensive cooling systems (e.g., thermal vias and liquid microchannels) may then be required for proper heat dissipation.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes have not been described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
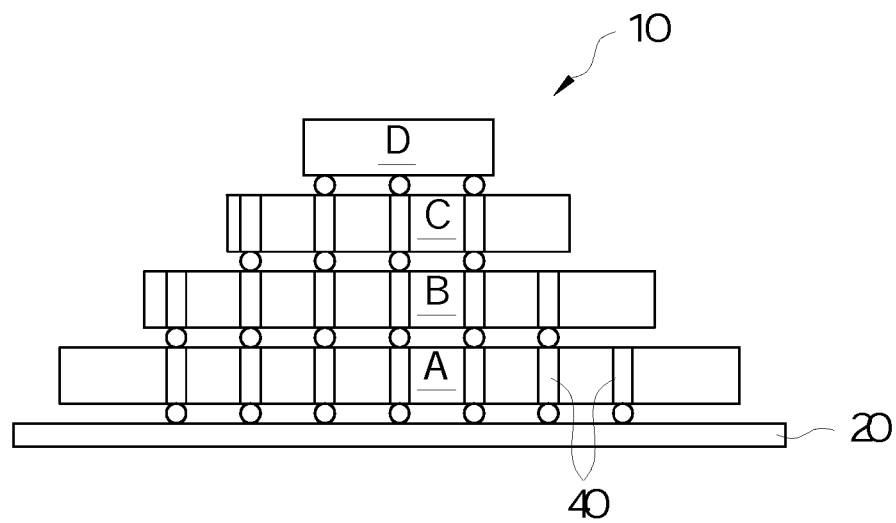
FIG. 1 is a cross-sectional view of a current 3D IC structure.
Figure 2:
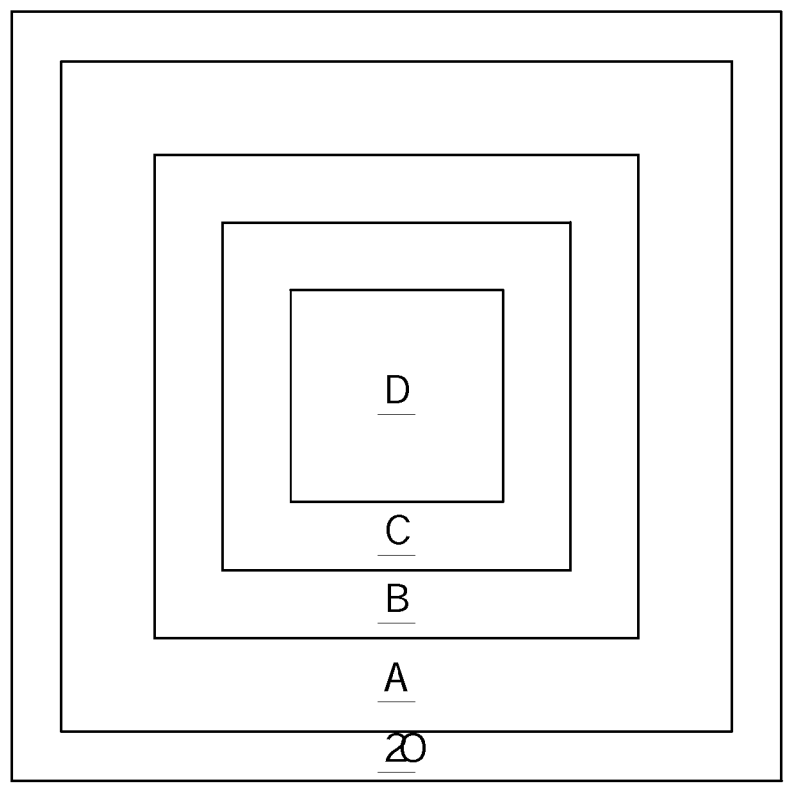
FIG. 2 is a top view of the 3D IC structure of FIG. 1.
Figure 3:
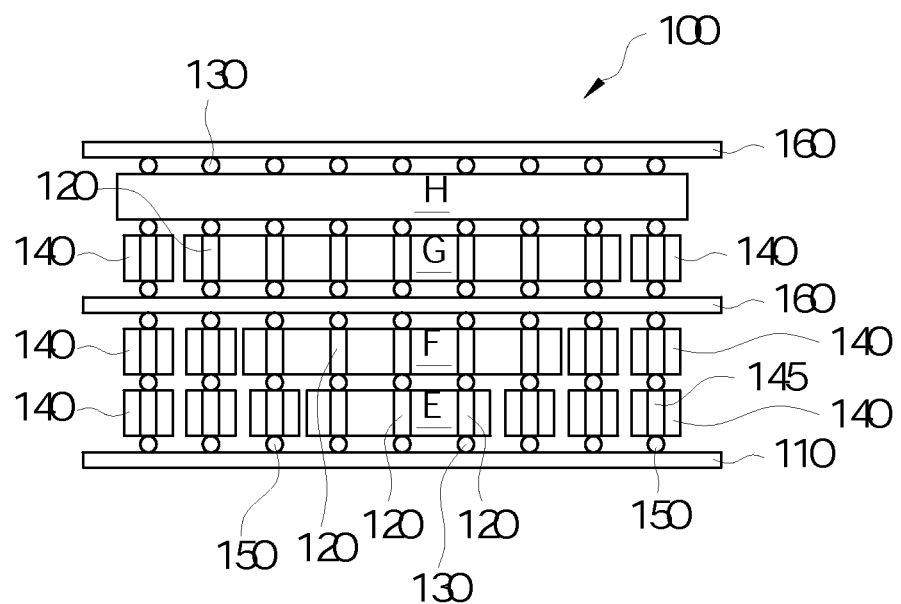
FIG. 3 is a cross-sectional view of a 3D IC structure, according to one embodiment of the present disclosure.
Figure 4:
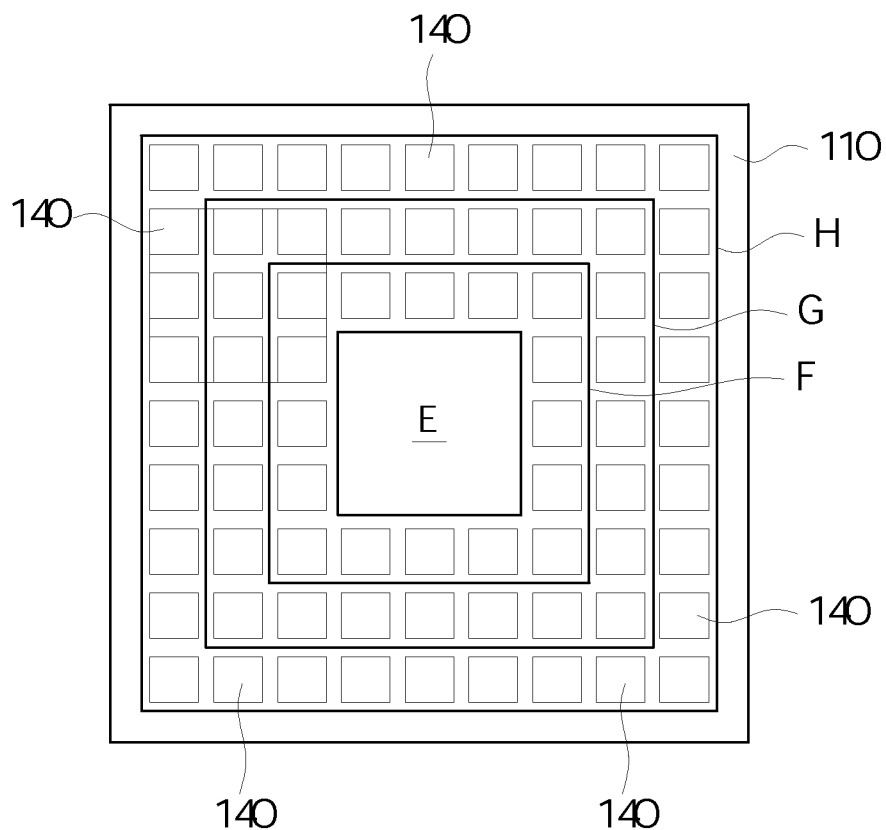
FIG. 4 is a bottom view of the 3D IC structure of FIG. 3.

Turning to FIG. 3 a cross-sectional view of a 3D IC structure 100, according to one embodiment of the present disclosure is depicted. A bottom-up view of the 3D IC structure of FIG. 3 is depicted in FIG. 4. 3D IC structure 100 includes a substrate 110, a first die E, a second die F, a third die G, a fourth die H, a plurality of peripheral through silicon via (TSV) structures 140, and interposers 160. Substrate 110 may comprise a silicon substrate although other semiconductor substrates, such as silicon-germanium substrate, III-V compound substrate, or silicon on insulator (SOI) substrate may be utilized in various embodiments. Dies E, F, G, and H may comprise silicon or other semiconductor materials, for example. Dies E, F, G, and H may include one or more conductive layers. There may be multiple metallization layers (not shown) formed within dies E, F, G, and H, for example, and dies E, F, G, and H may include a plurality of other layers such as inter-metal dielectric (IMD) layers (not shown). Dies E, F, G, and H may also include other active components or circuits, such as transistors, capacitors or other such devices. The details of the formation of devices are well known in the art of semiconductor device manufacturing and are not repeated herein. Dies E, F, G, and H may include one of a memory die, power device die, an ASIC (application specific integrated circuit) die, processor die, or other functional device die. According to some embodiments, 3D IC structure 100 includes additional dies therein (also not shown).

Inter-die communication is facilitated by vertical TSVs 120. The TSVs 120 pass completely through the dies and pass power and/or signals to any or all dies. According to one embodiment, one die having a TSV passing power and another TSV passing signals is connected to another die having a TSV passing power and another TSV passing signals, respectively. Any or all of dies E, F, G, and H may comprise TSVs 120. For example, in one embodiment dies E, F, and G comprise TSVs 120. In another embodiment, dies E, F, G, and H comprise TSVs 120. Any number of TSVs 120 can be provided as is electrically and mechanically dictated by the design. Bumps 130 that sit on pads (not shown) provide electrical communication between the dies.

To resolve the 3D IC power and thermal management issue, an approach according to an aspect of the present disclosure is to implement a plurality of peripheral TSV structures in the 3D IC. By decoupling the die and inter die signal and/or power connections in the die, and instead incorporating them in peripheral TSV structures, the peripheral TSV structures can directly supply the power and/or signal to individual stacked dies. An advantage of this approach is that the active die area is minimized for cost reduction and yield improvement. Further, this arrangement resolves the 3D IC IR drop problem mentioned above by reducing increased power densities that can result from stacking one core of a die upon another core of a die. Moreover, heat dissipation of 3D ICs is improved and expensive cooling approaches such as thermal vias and microchannels are eliminated. Further, strategically placed peripheral TSV structures can help establish a thermal path from the core of a die to the heat sink.

Still referring to FIG. 3, the 3D IC structure 100 has a plurality of peripheral TSVs 140. One or more peripheral TSV structures 140 are formed or disposed adjacent to one or more sides of any or all dies E, F, G, or H. According to the embodiment depicted in FIG. 3, the 3D IC structure 100 has three TSV structures 140 disposed on the four sides of die E; two TSV structures 140 disposed on the sides of die F; one TSV structure 140 disposed on the sides of die G; and no TSV structure 140 disposed on either sides of die H. In some embodiments, any number of TSV structures 140 may be disposed on one side, two sides, three sides, any number of sides, or on all sides of any or all dies E, F, G, or H. In some embodiments, any number of peripheral TSV structures 140 may be formed surrounding any or all dies E, F, G, or H. The 3D IC structure 100 of FIG. 3 shows the largest active die H with high heat dissipation placed at the top of 3D IC structure 100. This arrangement not only provides more space to accommodate the peripheral TSV structures 140 but also provides a large area with shorter conductivity paths.

Figure 5:
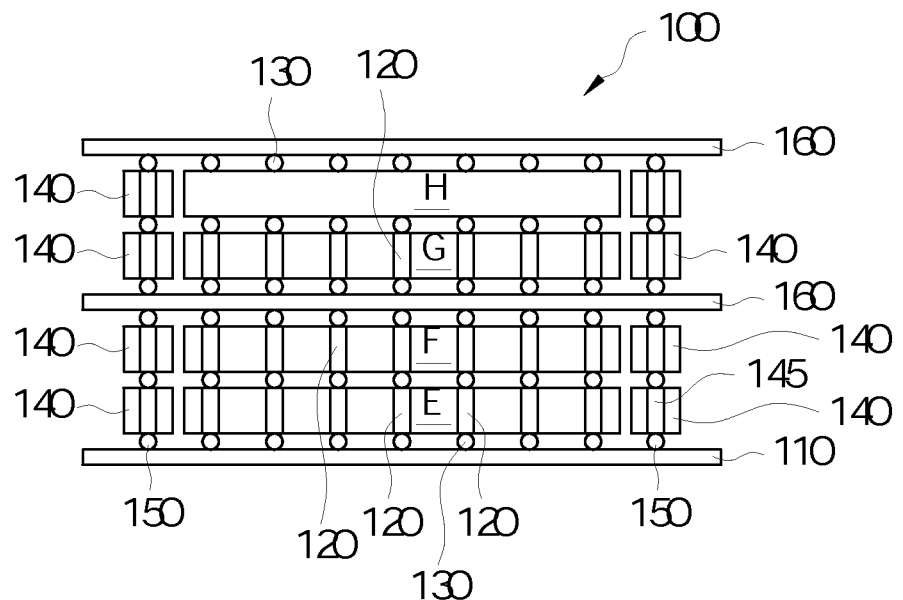
FIG. 5 is a cross-sectional view of a 3D IC structure, according to another embodiment of the present disclosure.
Figure 6:
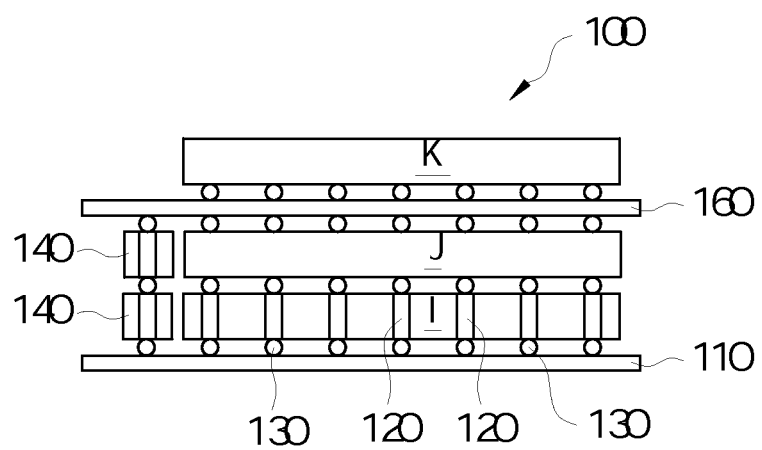
FIG. 6 is a cross-sectional view of a 3D IC structure, according to yet another embodiment of the present disclosure.

FIG. 5 is a cross-sectional view of a 3D IC structure, according to another embodiment of the present disclosure. 3D IC structure 500 includes a substrate 110, a first die E, a second die F, a third die G, a fourth die H, a plurality of peripheral through silicon via (TSV) structures 140, and interposers 160. The cross-sectional view of 3D IC structure 100 depicts one or more peripheral TSV structure 140 disposed on the sides of dies E, F, G, and H. FIG. 6 is a cross-sectional view of a 3D IC structure, according to yet another embodiment of the present disclosure. A 3D IC structure 600 includes dies I, J, and K. Here, one or more peripheral TSV structures 140 are disposed on a side of dies I and J. From these and other embodiments, it is understood by those skilled in the art that the number of peripheral TSV structures 140 may be placed or disposed near any one or more sides or any or all dies are dictated by the design and therefore, the scope of the invention is not limited to any one configuration. Any number of peripheral TSV structures 140 can be provided in 3D IC structures 100, 500, and 600 as is electrically and mechanically dictated by the design. It is also understood that the one or more TSV structures 140 may each be varied by size, shape, and material to fit the requirements of a particular design.

Turning back to FIG. 3, inter-die communication among dies E, F, G, and H is facilitated by vertical TSVs 145 in the corresponding TSV structures 140. TSVs 145 pass completely through the corresponding TSV structure 140 and pass power and/or signals to any or all dies E, F, G, or H. Bumps 150 that sit on pads (not shown) provide electrical communication between the dies.

Peripheral TSV structures 140 are formed as individual building blocks using low end technology for fabrication. The number of peripheral TSV structures 140 can be increased to improve the IR drop and heat dissipation without active die modification. In one exemplary embodiment for the formation of TSV 145, the peripheral TSV structure 140 is patterned and then etched using a reactive-ion plasma process or wet etch, for example, to form an opening in peripheral TSV structure 140. The TSV opening is then filled with a conductive material. Metal, such as aluminum (Al), copper (Cu), alloys and the like may be sputtered, electro-plated, or screen-printed to fill the opening. Optionally, the process may include sputtering a seed layer of a metal, such as Cu, for example, into the TSV opening. The TSV opening may then be electro-plated with Cu, for example. Alternatively, other conductive materials may be used. Following the deposition of conductive material, the TSV structure may be planarized by a chemical mechanical planarization (CMP) process. In an exemplary embodiment of the present disclosure, the TSV opening is filled with Cu, as copper has thermal conductivity several orders higher than air. Copper also provides a low thermal resistivity path to resolve the heat dissipation problem.

With reference again to FIGS. 3, 5, and 6, an optional interposer 160 is formed between any two dies. By acting as a horizontal connection for the TSV structures 140 and/or dies, the interposer 160 enhances the power and/or signal distribution among the dies. In FIG. 5, where identical active dies E, F, G, and H are stacked together, it is difficult to insert additional peripheral TSV structures 140. In such a case, the optional interposer 160 is introduced to provide additional horizontal routing resources for active dies to connect with peripheral TSV structures 140. The optional interposer 160 can also be placed at the top active die to increase the area for heat dissipation. Interposer 160 also acts as a heat sink with such a placement.

As can be seen from the foregoing, by using peripheral TSV structures in 3D IC architecture, 3D ICs can pack a great deal of functionality into a small "footprint" offering several advantages. The active die area is minimized for cost reduction and yield improvement. Critical electrical paths through the 3D IC can be drastically shortened, leading to faster operation. Further, this arrangement resolves the 3D IC IR drop problem mentioned above by reducing increased power densities that can result from stacking one core of a die upon another core of a die. Moreover, heat dissipation of 3D ICs is improved and expensive cooling approaches such as thermal vias and microchannels are avoided. Further, strategically placed peripheral TSV structures can help establish a thermal path from the core of a die to the heat sink. The peripheral TSV structures can also be used in a non-electrical capacity to conduct heat and alleviate hot spots in 3D ICs.

In the preceding detailed description, the present disclosure is described with reference to specifically exemplary embodiments thereof. It will, however, be evident that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the invention as expressed herein.

What is claimed is:

1. A three dimensional (3D) integrated circuit (IC) structure, comprising:
   at least first and second dies, each of the first and second dies having at least one power through silicon via (TSV) and one signal TSV, the at least one power TSV and one signal TSV of the first die connected to the at least one power TSV and one signal TSV of the second die, respectively; and
   one or more peripheral TSV structures disposed adjacent to one or more sides of the first and/or the second die and configured to supply power or signals to the first and/or second dies, wherein the one or more peripheral TSV structures are separate from the at least first and second dies.

2. The 3D IC structure of claim 1, further comprising an interposer disposed between the first and the second dies.

3. The 3D IC structure of claim 1, wherein the one or more peripheral TSV structures are disposed around the first die and/or the second die.

4. The 3D IC structure of claim 1, wherein the one or more peripheral TSV structures supply at least power and signals.

5. The 3D IC structure of claim 1, further comprising a third die, the third die having at least a power TSV and a signal TSV, the at least one power TSV and one signal TSV of the third die connected to the at least one power TSVs and one signal TSVs of the first and/or second dies, respectively.

6. The 3D IC structure of claim 5, further comprising one or more peripheral TSV structures disposed adjacent to a side of the third die.

7. The 3D IC structure of claim 6, wherein a number of peripheral TSV structures adjacent to the third die is different from a number of peripheral TSV structures adjacent to the second die and a number of peripheral TSV structures adjacent to the first die.

8. The 3D IC structure of claim 6, wherein a number of peripheral TSV structures adjacent to the third die is the same as a number of peripheral TSV structures adjacent to the second die and a number of peripheral TSV structures adjacent to the first die.

9. The 3D IC structure of claim 5, wherein the one or more peripheral TSV structures are disposed around the third die.

10. The 3D IC structure of claim 5, wherein the one or more peripheral TSV structures disposed adjacent to a side of the third die supplies power.

11. The 3D IC structure of claim 5, wherein the one or more peripheral TSV structures disposed adjacent to a side of the third die supplies signals.

12. The 3D IC structure of claim 5, wherein the one or more peripheral TSV structures disposed adjacent to a side of the third die supplies at least power and signal.

13. The 3D IC structure of claim 1, wherein a number of peripheral TSV structures adjacent to the first die is different from a number of peripheral TSV structures adjacent to the second die.

14. The 3D IC structure of claim 1, wherein a number of peripheral TSV structures adjacent to the first die is the same as a number of peripheral TSV structures adjacent to the second die.

15. A 3D IC structure, comprising:
a first die having at least a power TSV and a signal TSV, the first die being surrounded by a plurality of peripheral TSV structures, wherein each peripheral TSV structure of the plurality of peripheral TSV structures is an individual block;
a second die having at least a power TSV and a signal TSV, the second die being surrounded by a plurality of peripheral TSV structures; and
a third die having at least a power TSV and a signal TSV, the third die being surrounded by a plurality of peripheral TSV structures,
wherein the plurality of peripheral TSV structures are configured to supply power or signals.

16. The 3D IC structure of claim 15, further comprising an interposer disposed between the first and second dies.

17. The 3D IC structure of claim 15, wherein the plurality of peripheral TSV structures supply at least power and signals.

18. A 3D IC structure, comprising:
a first die having at least a power TSV and a signal TSV;
one or more peripheral TSV structures disposed separate from and adjacent to one or more sides of the first die;
a second die;
a third die having at least a power TSV and a signal TSV; and
an interposer disposed between the second die and the third die,
wherein the one or more peripheral TSV structures are configured to supply power or signals.

19. The 3D IC structure of claim 18, wherein the one or more peripheral TSV structures are disposed around the first die.

20. The 3D IC structure of claim 18, wherein the one or more peripheral TSV structures supply at least power and signals.

* * * * *